United States Patent
Englberger et al.

(10) Patent No.: US 12,292,119 B2
(45) Date of Patent: May 6, 2025

(54) SLIDING ELEMENT, IN PARTICULAR PISTON RING

(71) Applicant: FEDERAL-MOGUL BURSCHEID GMBH, Burscheid (DE)

(72) Inventors: Gregor Englberger, Dresden (DE); Marcus Kennedy, Dusseldorf (DE); Yuriy Ivanov, Burscheid (DE)

(73) Assignee: FEDERAL-MOGUL BURSCHEID GMBH, Burscheid (DE)

( * ) Notice: Subject to any disclaimer, the term of this patent is extended or adjusted under 35 U.S.C. 154(b) by 0 days.

(21) Appl. No.: 18/245,620

(22) PCT Filed: Sep. 10, 2021

(86) PCT No.: PCT/EP2021/074986
§ 371 (c)(1),
(2) Date: Mar. 16, 2023

(87) PCT Pub. No.: WO2022/058249
PCT Pub. Date: Mar. 24, 2022

(65) Prior Publication Data
US 2023/0332686 A1    Oct. 19, 2023

(30) Foreign Application Priority Data

Sep. 16, 2020   (DE) .................... 10 2020 124 180.1

(51) Int. Cl.
F16J 9/26    (2006.01)

(52) U.S. Cl.
CPC ...................... F16J 9/26 (2013.01)

(58) Field of Classification Search
CPC ...................... F16J 9/26; F16J 9/00
See application file for complete search history.

(56) References Cited

U.S. PATENT DOCUMENTS

| | | | | |
|---|---|---|---|---|
| 9,488,276 B2 * | 11/2016 | Kennedy | ...................... | F16J 9/26 |
| 10,131,988 B2 * | 11/2018 | Kennedy | ............... | C23C 28/046 |
| 11,168,790 B2 * | 11/2021 | Kameda | ................... | F16N 15/02 |
| 2009/0186206 A1 | 7/2009 | Ito et al. | | |
| 2011/0268946 A1 * | 11/2011 | Fischer | ................. | C23C 28/347 |
| | | | | 277/444 |
| 2015/0226260 A1 * | 8/2015 | Inami | ..................... | F16C 33/16 |
| | | | | 508/109 |
| 2015/0292622 A1 * | 10/2015 | Kennedy | .................... | F16J 9/26 |
| | | | | 277/442 |
| 2015/0362071 A1 * | 12/2015 | Ivanov | .................. | C23C 28/347 |
| | | | | 277/442 |
| 2016/0341312 A1 * | 11/2016 | Kennedy | ............. | C23C 16/0281 |
| 2017/0102071 A1 * | 4/2017 | Banfield | .................... | F16J 9/26 |
| 2017/0175622 A1 * | 6/2017 | Avelar Araujo | .......... | F02F 3/10 |
| 2019/0128420 A1 * | 5/2019 | Kennedy | ............... | C23C 28/347 |
| 2020/0056700 A1 | 2/2020 | Kameda et al. | | |
| 2020/0217416 A1 * | 7/2020 | Okazaki | .............. | C23C 14/0605 |
| 2020/0284344 A1 * | 9/2020 | Jenness | ....................... | F16J 9/20 |
| 2020/0284345 A1 * | 9/2020 | Shinohara | ................. | F02F 5/00 |

FOREIGN PATENT DOCUMENTS

| | | |
|---|---|---|
| CN | 109072407 A | 12/2018 |
| DE | 102005063123 B3 | 5/2007 |
| DE | 102008042747 A1 | 4/2010 |
| DE | 102013200846 A1 | 7/2014 |
| EP | 1829986 B1 | 4/2010 |
| JP | 2002348668 A | 12/2002 |
| JP | 2004010923 A | 1/2004 |
| JP | 2018003880 A | 1/2018 |

OTHER PUBLICATIONS

Schultrich B et al: "Elastic modulus as a measure of diamond likeness and hardness of amorphous carbon films", Diamond and Related Materials, Elsevier Science Publishers, Amsterdam, N., Bd. 5, Nr. 9, Jul. 1, 1996, Seiten 914-918, XP004080594, ISSN: 0925-9635, DOI: 10.1016/0925-9635(95) 00439-4.

CN Office Action dated Feb. 22, 2025 for corresponding CN Patent Application for Intervention No. 202180063677.8; China National Intellectual Property Administration, English Language translation—8 pgs.

* cited by examiner

*Primary Examiner* — Eugene G Byrd
(74) *Attorney, Agent, or Firm* — Dickinson Wright PLLC

(57) ABSTRACT

A sliding element, in particular a piston ring, comprises a coating having the following layers from the inside to the outside: an adhesive layer, a carbon-containing functional layer and an outer amorphous DLC layer. The layer thickness of the carbon-containing function layer is at least 70%, preferably at least 80%, of the total layer thickness of the coating, and the Young's modulus ratio of carbon-containing functional layer to outer amorphous DLC layer is 1.2 or more.

17 Claims, No Drawings

SLIDING ELEMENT, IN PARTICULAR PISTON RING

BACKGROUND

1. Technical Field

The invention relates to a sliding element, in particular a piston ring, having a coating.

2. Related Art

Sliding elements, such as, for example, piston rings, have running surfaces on which they are in sliding contact with a friction partner. The tribological system is complex and is significantly determined by the material pairing of the friction partner and the environmental conditions such as, for example, pressure, temperature and surrounding media. Especially with modern engines, particularly high loads occur on the piston rings. To ensure and prolong the functionality and lifetime of the components, the running surface properties of the sliding elements can be specifically optimized.

Such optimizations often comprise applying more or less complex layer systems by means of, for example, thermal spraying processes, galvanic processes or thin-layer-technology processes. The primary objective of such layers is to protect against wear, and focus is first usually on a high degree of hardness of the layers. Diamond-like carbon layers (diamond-like carbon, DLC) have proven to be particularly hard and tenable layers. These may be varied in their properties in many ways, for example by changing their C—C bonding character, the different bonding fractions of the carbon and by the presence or absence of hydrogen and metals. Often adhesive layers are applied under these wear protection layers, which are supposed to ensure a particularly tenable and strong bonding of the highly strained wear protection layer with the base material of the sliding element.

However, the exclusive use of very hard DLC layers leads to some technological problems. On the one hand, the surfaces of these layers must be very smooth so that at a higher surface pressure, disruptions do not occur on the surface and so that the layer system does not fail. It can furthermore be shown that, for example, the ring wear and liner wear increase significantly with the roughness of the wear protection layers. Thus, it is necessary to smooth the surfaces of the wear protection layers as much as possible prior to use, however this is associated with extensive technical effort and is very cost-intensive. For example, EP 1 829 986 B1 describes a method how such hard carbon-based layers can be machined by means of bristle-shaped or plate-shaped elements. Moreover, very hard wear protection layers have unfavorable run-in behavior. Owing to its high degree of hardness, the run-in occurs at the expense of the friction partner which in the run-in phase undergoes increased wear, additionally the formation of scoring and/or burn marks can occur.

In view of the run-in behavior, it can be expedient to provide run-in layers on the wear protection layers. The objective of these layers is to generate a kind of tribological "balance" in that the run-in layer is stripped at the first contact with the friction partner, and in doing so it performs a reciprocal adjustment of the friction partners. Following the run-in phase, the frictional wear slows down and stabilizes and the hard wear protection layer then ensures long-term favorable friction properties and the lifetime durability.

DE 10 2005 063 123 B3 describes a layer system on a sliding element, consisting from the inside to the outside of a wear protection layer, an adhesive layer and a run-in layer of the type Me-C: H, in which hard material particles are also contained, for example WC.

A sliding element is evident from DE 10 2008 042 747 A1 having a coating which from the inside to the outside has an adhesive layer, a PVD layer, optionally a carbon-based layer of the type a-C: H: W, a carbon-based layer of the type a-C: H and a further carbon-based layer of the type a-C: H. It is envisaged that the outer carbon layer is softer than the underlying carbon layer.

DE 10 2013 200 846 A1 describes a sliding element having a coating which from the inside to the outside has a first adhesive layer, a hard hydrogen-free DLC layer, a second adhesive layer, a soft hydrogen-containing, metal-containing and/or metal-carbide-containing DLC layer and a hard hydrogen-containing DLC layer, wherein the soft hydrogen-containing DLC layer is softer than the hard hydrogen-free DLC layer, and the hard hydrogen-containing DLC layer is harder than the soft hydrogen-containing DLC layer.

SUMMARY OF THE INVENTION

Against this background, a sliding element, in particular a piston ring for combustion engines, with optimal mechanical and tribological properties is provided. In particular, the sliding element has a surface which has favorable run-in behavior, i.e. shortened run-in times, reduced counter body wear and less fuel and oil consumption during the run-in.

The sliding element comprises a coating having the following layers from the inside to the outside: an adhesive layer, a carbon-containing functional layer, and an outer amorphous DLC layer, wherein the layer thickness of the carbon-containing functional layer is at least 70% of the total layer thickness of the coating, and the Young's modulus ratio of carbon-containing functional layer to outer amorphous DLC layer is 1.2 or more.

It was found that, on the one hand, improved thermal resistance of the carbon-containing functional layer can be achieved by increasing the Young's modulus (or the $sp^3$ content in a DLC layer) but that, on the other hand, smoothing layers with increased Young's modulus becomes significantly more difficult and thus uneconomical. This dilemma is solved in that, firstly, a carbon-containing functional layer is provided having a high Young's modulus in relation to the outer DLC layer and carrying the largest proportion of the coating, i.e. at least 70% of the total thickness. Thus, the aforementioned carbon-containing functional layer contributes substantially to the improved thermal resistance. Secondly, the outer amorphous DLC layer, which is thinner relative to the carbon-containing functional layer and has a substantially lower Young's modulus, ensures low roughness. The latter layer thus also ensures improved run-in behavior.

According to an advantageous embodiment, the Young's modulus of the outer amorphous DLC layer is lower by at least 50 GPa, preferably at least 70 GPa, than the Young's modulus of the carbon-containing functional layer. Preferably, the coating of the sliding element consists exclusively of the aforementioned partial layers.

The adhesive layer preferably consists of multiple layers.

If the carbon-containing functional layer consists of multiple partial layers, the value for the Young's modulus refers in the context of this disclosure to the outermost partial layer of the carbon-containing functional layer.

Preferably, the sliding element has a total layer thickness of at least 5 μm, preferably between 5 and 40 μm.

Advantageously, the hardness ratio of carbon-containing functional layer to outer amorphous DLC layer is 1.2 or more, preferably the hardness ratio is in the range of 1.2 to 6.

It has further been found that the Young's modulus of the carbon-containing functional layer is advantageously at least 200 GPa, preferably at least 350 GPa, particularly preferred in the range of 250 to 600 GPa.

According to a preferred embodiment, the Young's modulus of the outer amorphous DLC layer is also at most 500 GPa, preferably at most 350 GPa, more preferably the Young's modulus is in the range of 100 to 350 GPa.

Preferably, the hardness of the outer amorphous DLC layer is at most 5000 HV 0.02, particularly preferred the hardness is in the range of 1000 to 3500 HV 0.02.

Advantageously, the carbon content of the outer amorphous DLC layer is at least 90 at. %, preferably at least 97 at. %.

The carbon-containing functional layer and/or the outer amorphous DLC layer preferably have a hydrogen content less than 3 at %, preferably less than 0.5 at %. In particular, hydrogen-free DLC layers (in this context, hydrogen-free corresponds to a hydrogen content of less than 3 at. %) have high potential regarding friction and wear reduction in highly strained tribosystems even under starved lubrication conditions.

According to an advantageous embodiment of the invention, the carbon-containing functional layer has, preferably from the inside to the outside, the following layers: an $A_xC_y$ layer, C standing for carbon, A standing for a metal, and x as well as y each comprising values of 1 to 99, and/or a crystalline-containing carbon layer of an inner metal-containing carbon partial layer and an outer crystalline-containing carbon partial layer, and/or at least one amorphous carbon layer having a higher Young's modulus than the outer amorphous DLC layer. A coating system of this type is characterized by particularly advantageous tribological properties.

Advantageously, the adhesive layer contains metal, and the metal A in the $A_xC_y$ layer corresponds to a metal in the metal-containing adhesive layer, the metal A being preferably chosen from tungsten, titanium, chromium or a further transition metal.

Another embodiment of the sliding element envisages that the carbon-containing functional layer has a plurality of amorphous carbon layers, and the Young's modulus of the amorphous carbon layers decreases from the inside to the outside. Alternatively or additionally, the carbon-containing functional layer may comprise at least one amorphous carbon layer having a Young's modulus which decreases in a graded manner from the inside to the outside.

Preferably, the sliding element has between the $A_xC_y$ layer and the crystalline-containing carbon layer a transition layer which is constituted by a mixed phase of the $A_xC_y$ layer and the crystalline-containing carbon layer and which preferably has a thickness of 1 to 25 nm.

Advantageously, the $A_xC_y$ layer has a thickness of 3 nm to 10 nm, preferably 4 nm to 8 nm.

The crystalline-containing carbon layer preferably also has a thickness of no more than 50 nm.

Preferably, the tactilely measured roughness of the coating fulfills the conditions Rk<1.4 μm and Rpk<0.3 μm, particularly preferred Rk<0.9 μm and Rpk<0.2 μm.

Moreover, the optically measured roughness of the coating preferably fulfills the conditions Rk<2.0 μm and Rpk<0.5 μm, particularly preferred Rk<1.5 μm and Rpk<0.4 μm.

According to an advantageous embodiment of the invention, at least one of the individual layers of the coating is produced by a PVD process.

EMBODIMENT EXAMPLE

Within the scope of the present invention, the influence of the layer structure according to embodiments of the invention was tested in comparison with two reference examples. All examples have a coating with a total layer thickness of about 23 μm. The two comparative examples have a carbon-containing functional layer on the outermost periphery of the sliding element, while the example according to an embodiment of the invention additionally has an outer amorphous DLC layer with a layer thickness of about 4 μm on the carbon-containing functional layer. The first comparative example and the second comparative example differ primarily in the Young's modulus of the carbon-containing functional layer: While the first comparative example, with 200 to 290 GPa, has in this respect a relatively low Young's modulus, this is significantly higher, with 350 to 450, in the second comparative example. The example according to the invention, with 350 to 500 GPa, also has a relatively high Young's modulus in the carbon-containing functional layer; the Young's modulus in the outer amorphous DLC layer, with 200 to 350 GPa, is again relatively low. For the example according to the embodiment invention, the Young's modulus ratio from carbon-containing functional layer to outer layer is >1.2. In the absence of a dedicated additional outer layer, the Young's modulus ratio cannot be determined in the comparative examples. The differences between the examples can be seen in the table below:

TABLE 1

| | Comparative Example 1 | Comparative Example 2 | Example according to the invention |
|---|---|---|---|
| Total layer thickness [μm] | about 23 | about 23 | about 23 |
| Layer thickness outer amorphous DLC layer [μm] | not applicable | not applicable | about 4 |
| Young's modulus carbon-containing functional layer [GPa] | 200-290 | 350-450 | 350-500 |
| Young's modulus outer amorphous DLC layer [GPa] | not applicable | not applicable | 200-350 |
| Young's modulus ratio functional layer to outer layer [GPa] | — | — | >1.2 |

TABLE 1-continued

|  | Comparative Example 1 | Comparative Example 2 | Example according to the invention |
|---|---|---|---|
| Roughness Rk after machining [µm] - tactilely measured after smoothing | 0.3 | 1.5 | 0.5 |
| Roughness Rpk after machining [µm] - tactilely measured after smoothing | 0.07 | 0.4 | 0.1 |
| Layer robustness test at 350° C. | | | |
| Roughness Rk; Rpk prior to TT 350° C. [µm] - optically measured | 0.67; 0.2 | 2.1; 0.6 | 0.9; 0.2 |
| Roughness Rk; Rpk after TT 350° C. [µm] - optically measured | 1.1; 0.59 | 2.1; 0.7 | 1.1; 0.2 |
| Fulfilment of 30% rule after TT 350° C. [µm], i.e. roughness must not be increased by more than 30% after thermal test | no | yes | yes |
| Ring wear after TT 350° C. + Rig-test [µm] | 18 | 6.8 | 7.8 |
| Liner wear after TT 350° C. + Rig-test [µm] | 13 | 8.3 | 4.7 |

After the machining of the resulting coatings, the roughnesses Rk and Rpk were measured. The values reproduced in Table 1 confirm that a coating having a relatively low Young's modulus in the outermost layer (as in Comparative Example 1 and the example according to the embodiment of the invention) exhibits significantly improved roughness after machining compared with a coating having a relatively high Young's modulus in the outermost layer (as in Comparative Example 2). Studies on wear behavior in this context have demonstrated that the roughness parameters Rk and Rpk are decisive for the friction and wear behavior in the pairing of ring and running surface of the cylinder. If the roughness parameters Rk=1.5 µm and Rpk=0.4 µm are reached or exceeded, the wear of the running surface of the cylinder increases by more than 75% compared to the preferred maximum roughness parameters Rk=0.9 µm and Rpk=0.2 µm (values measured optically in each case before the layer robustness test at 350° C.). Comparative example 2 thus exhibits inadmissibly high roughness.

Following this, the thermal resistance of the coatings was studied in a test. The evaluation of the thermal resistance was performed by aging the layer at 350° C. for 24 hours under atmosphere and the subsequent comparative optical roughness measurement compared to the initial state. If, in the course of this process, there is an increase in roughness of the Rk or Rpk parameter by more than 30% compared to the initial state, the so-called 30% rule is not considered to be fulfilled. In other words, the roughness then deteriorates to an inadmissible degree under thermal load. In the present study, this applies to Comparison Example 1, see Table 1.

The subsequent tribological study of the coatings was carried out outside the engine on real ring segments, which under full lubrication conditions were moved in an oscillating tribometer against a real segment of the running surface of the cylinder and were subjected to a normal force. As outlined above, the tested layers were previously aged at 350° C. for 24 hours under atmosphere. Subsequent to the tribological tests outside the engine, the wear of the ring and the running surface of the cylinder was measured optically. The results listed in Table 1 show that Comparative Examples 1 and 2 exhibit inadmissibly high liner wear and that Comparison Example 1 additionally exhibits inadmissibly high ring wear.

The studies discussed above show that providing an outer amorphous DLC layer surprisingly leads to excellent wear resistance even at high temperatures.

The measurement of the parameters mentioned within the scope of this disclosure is performed as follows: For the measurement of the Young's modulus, grinding the layer is to be performed from the surface to the depth range of the layer to be measured. The measurement of the Young's modulus is carried out using a nanoindenter. The hardness test method to be applied is the microhardness test using an indentation method. The measuring points are to be selected such that they lie on the plateau, do not touch any depressions and the distance is three times the width of the diagonal (Berkovich test specimen) of the indentation to each other. The penetration depth of the specimen after grinding must not exceed 10% of the thickness of the coating area to be measured. The calculation is defined according to the method of Oliver and Pharr (see Oliver, W. C., Pharr, G. M., "An improved technique for determining hardness and elastic modulus using load and displacement sensing indentation experiments", J. Mat. Res., 7 (6), June 1992, pages 1564 to 1583).

A commercially available surface measuring device from Mahr, Hommel or similar is used for the tactile measurement of the roughness. At that, the following parameters are used:

TABLE 2

| Free tracer system = | e.g. MFW 250 with halved measuring force (approx. 0.5 mN) |
|---|---|
| probe tip radius = | 10 µm * |
| probe tip angle = | 90 |
| Lt = | 1.75 mm |
| Lm = | 1.25 mm |
| Lc = | 0.25 mm |
| Profile type = | R |
| Filter = | preferably ISO 16610 - 31 or DIN EN ISO 13565 ** |
| λs = | switched off |
| Printout/protocol = | Rk, Rpk and roughness profile |

* A probe tip radius of 10 µm and a reduced measuring force are specified since the layer is very hard. The recommended probe tip geometry ensures that a realistic service life of the probe tip is guaranteed. The probe tip must be regularly checked using a probe tip reference standard, e.g. Hall KNT 4050:01.

** The differences in the parameters between the recommended filters are in the single-digit nm range.

A white light confocal microscope, NanoFocus µsurf, is used for the optical measurement of the roughness. At that, the following parameters are used:

TABLE 3

| Resolution = | at least 984 × 984 (at a measuring surface 0.8 × 0.8 mm) corresponds to a pixel distance of 0.813 µm |
| --- | --- |
| Lens = | 20× |
| Lt = | 0.8 mm |
| Lm = | 0.75 mm |
| Lc = | 0.25 mm |
| Profile type = | R |
| Filter = | ISO 16610 - 31 |
| λs = | 0.0025 mm |
| Measurement spot: oil rings/steel band ring = | 0.05 mm × 0.8 mm, evaluate at least every fifth profile section within the measurement spot (50/0.813/5 = 12 measured tracks) |
| Printout/protocol = | Rk, Rpk and typical roughness profile |

The roughness values are the mean values of the evaluated measured tracks within the measurement spot.

The invention claimed is:

1. A sliding element with a coating having the following layers from the inside to the outside:
   an adhesive layer
   a carbon-containing functional layer, and
   an outer amorphous DLC layer,
   wherein the layer thickness of the carbon-containing functional layer is at least 70%, of the total layer thickness of the coating, and
   the Young's modulus ratio of carbon-containing functional layer to outer amorphous DLC layer is 1.2 or more.

2. The sliding element according to claim 1,
   wherein the total layer thickness is at least 5 µm.

3. The sliding element according to claim 1,
   wherein the hardness ratio of carbon-containing function layer to outer amorphous DLC layer is 1.2 or more.

4. The sliding element according to claim 1 wherein the Young's modulus of the carbon-containing functional layer is at least 200 GPa.

5. The sliding element according to claim 1 wherein the Young's modulus of the outer amorphous DLC layer is at most 500 GPa.

6. The sliding element according to claim 1 wherein the hardness of the outer amorphous DLC layer is at most 5000 HV 0.02.

7. The sliding element according to claim 1 wherein the carbon content of the outer amorphous DLC layer is at least 90 at %.

8. The sliding element according to claim 1
   wherein the carbon-containing functional layer and/or the outer amorphous DLC layer have a hydrogen content that is less than 3 at. %.

9. The sliding element according to claim 1
   wherein the carbon-containing functional layer has from the inside to the outside the following layers:
   an AxCy layer, C standing for carbon, A standing for a metal, and x as well as y each comprising values of 1 to 99, and/or
   a crystalline-containing carbon layer of an inner metal-containing carbon partial layer and an outer crystalline-containing carbon partial layer, and/or
   at least one amorphous carbon layer having a higher Young's modulus than the outer amorphous DLC layer.

10. The sliding element according to claim 9,
    wherein the adhesive layer contains metal, and metal A in the AxCy layer corresponds to a metal in the metal-containing adhesive layer, the metal A being chosen from tungsten, titanium, chromium or a further transition metal.

11. The sliding element according to claim 10,
    wherein the carbon-containing functional layer has multiple amorphous carbon layers and the Young's modulus of the amorphous carbon layers decreases from the inside to the outside, and/or the carbon-containing functional layer comprises at least one amorphous carbon layer having a Young's modulus which decreases from the inside to the outside in a graded manner.

12. The sliding element according to claim 9
    wherein the sliding element comprises a transition layer between the AxCy layer and the crystalline-containing carbon layer, the transition layer being constituted by a mixed phase of the AxCy layer and the crystalline-containing carbon layer, and which has a thickness of 1 to 25 nm.

13. The sliding element according to claim 9
    wherein the AxCy layer has a thickness of 3 nm to 10 nm.

14. The sliding element according to claim 9
    wherein the crystalline-containing carbon layer has a thickness of no more than 50 nm.

15. The sliding element according to claim 1
    wherein a tactilely measured roughness of the coating is Rk<1.4 µm and Rpk<0.3 µm.

16. The sliding element according to claim 1
    wherein an optically measured roughness of the coating Rk<is 2.0 µm and Rpk<is 0.5 µm.

17. The sliding element according to claim 1
    wherein at least one of the individual layers of the coating is produced by a PVD process.

\* \* \* \* \*